United States Patent
Moon et al.

(10) Patent No.: US 7,065,417 B2
(45) Date of Patent: Jun. 20, 2006

(54) MPEG PORTABLE SOUND REPRODUCING SYSTEM AND A REPRODUCING METHOD THEREOF

(75) Inventors: Kwang-su Moon, Seoul (KR); Jung-ha Hwang, Seoul (KR)

(73) Assignee: SigmaTel, Inc., Austin, TX (US)

( * ) Notice: Subject to any disclaimer, the term of this patent is extended or adjusted under 35 U.S.C. 154(b) by 1103 days.

(21) Appl. No.: 10/059,777

(22) Filed: Jan. 29, 2002

(65) Prior Publication Data

US 2002/0072818 A1 Jun. 13, 2002

Related U.S. Application Data

(62) Division of application No. 09/061,647, filed on Apr. 17, 1998.

(30) Foreign Application Priority Data

Nov. 24, 1997 (KR) ................................ 97-62315

(51) Int. Cl.
*G06F 17/00* (2006.01)

(52) U.S. Cl. ........................ 700/94; 381/61; 369/63; 704/272

(58) Field of Classification Search ............... 700/94; 704/270, 272, 278, 500; 369/31.01, 63; 360/32, 360/55; 361/61, 124; 84/601, 602, 604
See application file for complete search history.

(56) References Cited

U.S. PATENT DOCUMENTS

| | | | |
|---|---|---|---|
| 4,475,155 A | 10/1984 | Oishi et al. | |
| 4,905,289 A | 2/1990 | Micic et al. | |
| 4,912,632 A | 3/1990 | Gach et al. | |
| 4,970,659 A | 11/1990 | Breedlove et al. | |
| 5,119,485 A | 6/1992 | Ledbetter, Jr. et al. | |
| 5,170,490 A | 12/1992 | Cannon et al. | |
| 5,337,295 A | 8/1994 | Maeda | |
| 5,339,444 A | 8/1994 | Nakajima | |

(Continued)

FOREIGN PATENT DOCUMENTS

DE 299-10-175 10/1999

(Continued)

OTHER PUBLICATIONS

Wampold, J., "Progressive Networks and Audible Inc. Team Up to Make RealAudio Mobile," Sep. 15, 1997.

(Continued)

*Primary Examiner*—Xu Mei
(74) *Attorney, Agent, or Firm*—Toler Schaffer, LLP

(57) ABSTRACT

Disclosed is an MPEG portable sound reproducing system and a method for reproducing sound data compressed using the MPEG method. The inventive system includes power supply means for supplying operational power to the system, the power supply means being realized through a secondary battery; power processing means for rectifying power supplied from the power supply means to stable voltage and current; information display means for displaying numbers and combinations of letters related to operational states of the system; control means for controlling all operations of converting and reproducing sound data compressed using the MPEG method; data storage means for storing MPEG-compressed sound data in a designated address according to signals output from the control means; information selecting means for selecting general operations to reproduce, download, and apply selected sound data stored in the data storage means; sound reproducing means for converting sound data stored in the data storage means into a format audible to users according to signals output from the control means; and transmitting/receiving means for transmitting and receiving sound data and program data from external devices.

30 Claims, 6 Drawing Sheets

U.S. PATENT DOCUMENTS

| | | | |
|---|---|---|---|
| 5,359,698 A | 10/1994 | Goldberg et al. | |
| 5,457,672 A | 10/1995 | Shinada et al. | |
| 5,473,729 A | 12/1995 | Bryant et al. | |
| 5,477,511 A | 12/1995 | Englehardt | |
| 5,491,774 A | 2/1996 | Norris et al. | |
| 5,502,700 A | 3/1996 | Shinada | |
| 5,511,000 A | 4/1996 | Kaloi et al. | |
| 5,535,356 A | 7/1996 | Kim et al. | |
| 5,557,541 A | 9/1996 | Schulhof et al. | |
| 5,577,918 A | 11/1996 | Gordon | |
| 5,606,143 A | 2/1997 | Young | |
| 5,623,623 A | 4/1997 | Kim et al. | |
| 5,632,001 A | 5/1997 | Terauchi | |
| 5,636,186 A * | 6/1997 | Yamamoto et al. | 369/47.23 |
| 5,640,458 A | 6/1997 | Nishiguchi et al. | |
| 5,668,789 A | 9/1997 | Yokota et al. | |
| 5,670,730 A | 9/1997 | Grewe et al. | |
| 5,689,440 A | 11/1997 | Leitch et al. | |
| 5,694,332 A | 12/1997 | Maturi | |
| 5,694,516 A | 12/1997 | Grewe et al. | |
| 5,696,928 A | 12/1997 | Grewe et al. | |
| 5,699,336 A | 12/1997 | Maeda et al. | |
| 5,710,813 A * | 1/1998 | Terui et al. | 380/275 |
| 5,724,609 A | 3/1998 | Hatae et al. | |
| 5,748,835 A | 5/1998 | Lee | |
| 5,774,863 A | 6/1998 | Okano et al. | |
| 5,787,399 A | 7/1998 | Lee et al. | |
| 5,790,423 A | 8/1998 | Lau et al. | |
| 5,794,202 A | 8/1998 | Kim | |
| 5,809,245 A | 9/1998 | Zenda | |
| 5,839,108 A | 11/1998 | Daberko et al. | |
| 5,841,979 A | 11/1998 | Schulhof et al. | |
| 5,857,114 A | 1/1999 | Kim | |
| 5,870,710 A | 2/1999 | Ozawa et al. | |
| 5,903,868 A | 5/1999 | Yuen et al. | |
| 5,903,871 A | 5/1999 | Terui et al. | |
| RE36,218 E | 6/1999 | Maeda et al. | |
| 5,930,758 A | 7/1999 | Nishiguchi et al. | |
| 5,978,755 A | 11/1999 | Podhradsky | |
| 5,980,262 A | 11/1999 | Tseng et al. | |
| 6,007,228 A | 12/1999 | Agarwal et al. | |
| 6,031,915 A * | 2/2000 | Okano et al. | 381/56 |
| 6,032,081 A | 2/2000 | Han et al. | |
| 6,076,063 A | 6/2000 | Unno et al. | |
| 6,078,742 A | 6/2000 | Chow | |
| 6,108,743 A | 8/2000 | Debs et al. | |
| 6,122,699 A | 9/2000 | Omo et al. | |
| 6,151,286 A | 11/2000 | Inoue | |
| 6,182,043 B1 | 1/2001 | Boldl | |
| 6,311,092 B1 | 10/2001 | Yamada | |
| 6,321,129 B1 * | 11/2001 | D'Agosto, III | 700/94 |
| 6,332,175 B1 * | 12/2001 | Birrell et al. | 711/112 |
| 6,377,530 B1 * | 4/2002 | Burrows | 369/59.21 |
| 6,453,281 B1 * | 9/2002 | Walters et al. | 704/200 |
| 6,629,000 B1 * | 9/2003 | Moon et al. | 700/94 |
| 6,695,477 B1 | 2/2004 | Nishiguchi et al. | |
| 6,975,912 B1 * | 12/2005 | Iida | 700/94 |

FOREIGN PATENT DOCUMENTS

| | | |
|---|---|---|
| EP | 0467208 A1 | 7/1991 |
| EP | 0 798 929 | 10/1997 |
| EP | 0 798 929 A | 10/1997 |
| JP | 1205630 | 8/1989 |
| JP | 3230319 | 10/1991 |
| JP | 3235109 | 10/1991 |
| JP | 4061069 A | 2/1992 |
| JP | 4349269 A | 12/1992 |
| JP | 5217292 A | 8/1993 |
| JP | 5266645 A | 10/1993 |
| JP | 5314655 A | 11/1993 |
| JP | 05334893 A2 | 12/1993 |
| JP | 7-307674 | 11/1995 |
| JP | 8 205093 | 8/1996 |
| JP | 8 205093 A | 8/1996 |
| JP | 8202499 A | 8/1996 |
| JP | 9-73299 | 3/1997 |
| JP | 10-320000 | 12/1998 |
| JP | 3164089 B2 | 5/2001 |
| JP | 2002279730 A | 9/2002 |
| JP | 2002334521 A | 11/2002 |
| KR | 10-1991-11772 | 2/1992 |
| KR | 10-1995-35692 | 5/1997 |
| WO | WO 96 08006 | 3/1996 |
| WO | WO 96 08006 A | 3/1996 |
| WO | WO 96/25738 | 8/1996 |
| WO | WO 97 26744 | 7/1997 |
| WO | WO 97 26744 A | 7/1997 |

OTHER PUBLICATIONS

"Audible MobilePlayer and MobilePlayer-Plus User's Guide," Audible, Inc., 1997, pp. 1-7.

"Single-chip Solution for Audio Data Decompression with MPEG Layer 3 Method," ITT Semiconductors, Catalogue of MAS 3503 C, Feb. 1995, pp. 1-8.

"Compact Mulitmedia Players with PC Memory Cards Silicon View and Shopping Navigation;" IEEE, Iwadere et al., 1997, pp. 451-456.

"NEC Develops Flash-Memory Personal Stereo;" Audio Week, vol. 6, No. 47, Dec. 1994.

"NEC Unveils its Miniature Digital Videos, Music Player;" Billboard, Oct. 1995, p. 10.

"A New Implementation of the Silicon Audio Player Based on MPEG/Audio Decoder LSI;" IEEE, Sugiyama et al.; Mar. 1997, pp. 207-215.

"Portable Stereo from Memory Chip Card;" Screen Digest; Jan. 1995.

"Portable Translator;" IBM Technical Disclosure Bulletin; Nov. 1994, pp. 185-186.

"Portable Voice Messaging System;" IBM Technical Disclosure Bulletin; Jul. 1995, pp. 257-260.

"The Silicon Audio and Audio-Data Compression and Storage System with a Semiconductor Memory Card;" IEEE Transactions on Consumer Electronics, vol. 41, No. 1, Feb. 1995, pp. 186-194.

"Virtual Jukebox;" Google Groups, Aug. 3, 1997.

* cited by examiner

MPEG PORTABLE SOUND REPRODUCING SYSTEM AND A REPRODUCING METHOD THEREOF

CROSS-REFERENCE TO RELATED APPLICATIONS

This application is a divisional of U.S. application Ser. No. 09/061,647, filed Apr. 17, 1998.

BACKGROUND OF THE INVENTION (a) Field of the Invention

The present invention relates to a portable sound reproducing system and method, and more particularly, to a portable sound reproducing system and a reproducing method thereof in which sound data, compressed using the Moving Picture Experts Group (MPEG) method and stored in a memory device, is converted into an audible format and output through headphones, speakers, etc.

(b) Description of the Related Art

Generally, data processed to be listened or viewed is stored in a memory medium then output through a reproduction device. The most common examples include analog data stored on magnetic tape which is output through a cassette player, and digital data stored on a compact disc which is output through a compact disc player.

Recent developments in digital technology has enabled memory media used in personal computers to undergo vast improvements. Namely, memory media used in PCs are becoming increasingly lightweight and compact, and providing the user with more capacity to store memory.

However, with the increase in required memory needed to run operating systems and application software, there is a limit to how efficiently memory media can be used. In an attempt to remedy this problem, a variety of methods have been devised to enable the efficient use of digital data. The MPEG standard is one of these methods which increases the storage capacity of memory media by compressing data stored therein.

Namely, by using the MPEG method of compressing data, data is compressed to roughly one-twelfth its original size without compromising sound or visual quality. After compresing data utilizing software or hardware made for this purpose, the data is then stored in a storage medium, then converted back into its original state using the MPEG method such that the data is placed in a form that can be heard or seen by the user. The MPEG method, therefore greatly increases data storage capacity.

With all the conventional sound reproduction systems, i.e., tape players and compact disc players, and PCs, etc. which are equipped with the capability to reproduce MPEG-compressed data, many disadvantages are encountered by the user.

In particular, in using cassette players, which reproduce data stored on magnetic tape, because the same amount of time is needed to store (record) data as it does to reproduce (play) the data, the storing process is time-consuming, and heat generated during the process acts to deteriorate the quality of the recording such that the quality of the sound reproduced is decreased. Moreover, because magnetic tape is easily worn, the repetitive playing of data stored on the cassette tape also acts to reduce sound quality.

Compact disc players and the discs used therein also have many problems. Namely, recording is not possible on compact discs. Further, because of the mechanical fragility of CD players, reproduction malfunctions occur when the players receive even slight outside shocks. Finally, CD players have a limited life span as the mechanical parts in the devices often break over time.

The storage media used in cassette and CD players also have the drawback of occupying much space. Also, users must take great care that the storage media are placed in an area that is not exposed to heat, direct sunlight, etc.

With regard to prior art devices such as PCs used to reproduce data stored using the MPEG method, as these devices are not portable, the location at which users can access the sound and images is limited to the location of the device. In addition, when using a PC to reproduce data compressed using the MPEG method, the cost of equipping the PC with software or hardware to enable this function is high. Also, because various types of sound data are stored on a plurality of storage media, the user must purchase many kinds of storage media and undergo complicated processes to reproduce the data stored therein.

Finally, in all of the above cases, users must physically go to retail stores to purchase storage media, causing inconvenience to the user.

SUMMARY OF THE INVENTION

The present invention has been made in an effort to solve the above problems. It is an object of the present invention to provide an MPEG portable sound reproducing system and a reproducing method thereof which reproduces sound data, compressed and stored on a memory chip using the MPEG method, into an audible format.

It is another object of the present invention to provide an MPEG portable sound reproducing system which, by storing data on a semiconductor storage medium, prevents heat from generating during recording as in the prior art cassette tape player, and avoids damage from exposure to heat as with conventional cassette tapes, compact discs, and other storage media.

It is still yet another object of the present invention to provide an MPEG portable sound reproducing system which enables connection to telecommunications networks and data vending machines such that various data can be downloaded, thereby enabling users to enjoy the benefits—speed, convenience, variety, etc.—of these systems.

It is still yet another object of the present invention to provide an MPEG portable sound reproducing system in which data downloaded via telecommunications networks and data vending machines as in the above is able to be accessed by and saved on a personal computer.

It is still yet another object of the present invention to provide an MPEG portable sound reproducing system which does not require separate storage media as with cassette players and compact disc players such that the device can be made to be lightweight and thin, and the need for physical storage space of the storage media is not needed.

To achieve the above objects, the present invention provides an MPEG portable sound reproducing system and a method for reproducing sound data compressed using the MPEG method. The inventive system includes power supply means for supplying operational power to the system, the power supply means being realized through a secondary battery; power processing means for rectifying power supplied from the power supply means to stable voltage and current; information display means for displaying numbers and combinations of letters related to operational states of the system; control means for controlling all operations of converting and reproducing sound data compressed using the MPEG method; data storage means for storing MPEG-compressed sound data in a designated address according to signals output from the control means; information selecting means for selecting general operations to reproduce, download, and apply selected sound data stored in the data storage means; sound reproducing means for converting sound data stored in the data storage means into a format audible to users according to signals output from the control means; and transmitting/receiving means for transmitting and receiving sound data and program data from external devices.

The inventive sound reproducing method includes the steps of initializing the system and detecting a state of a flash ROM when power is supplied to information selecting means; loading a main program from the flash ROM, if it is detected that the state of the flash ROM is normal, and completing booting of required software; and downloading and reproducing stored sound data, if the set up of the operational environment is completed, according to signals output from the information selecting means a state of operational power, and whether connection is made to an external power supply and to external telecommunications systems, etc.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
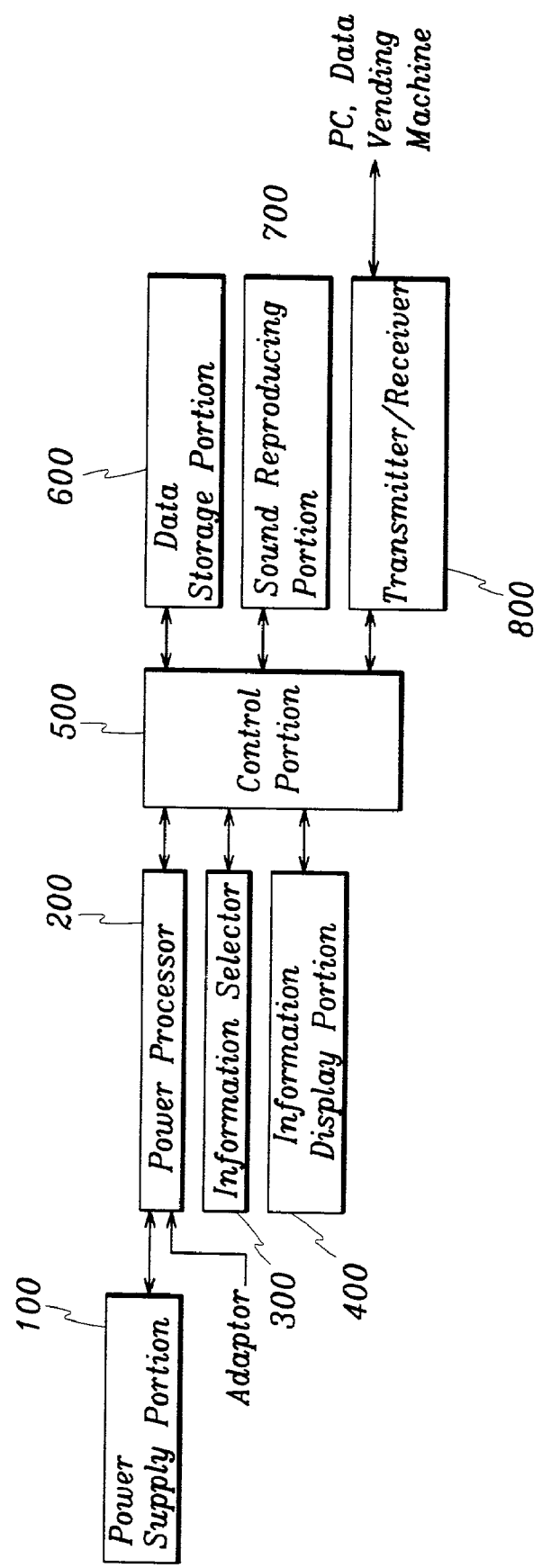
FIG. 1 is a block diagram of an MPEG portable sound reproducing system according to a preferred embodiment of the present invention.

Referring first to FIG. 1, an inventive MPEG portable sound reproducing system comprises a power supply portion 100, a power processor 200, an information selector 300, an information display portion 400, a control portion 500, a data storage portion 600, a sound reproducing portion 700, and a transmitter/receiver 800.

The power supply portion 100 is realized through a nickel-cadmium (Ni—CD), nickel-metal hydride (Ni—MH), lithium-ion, or lithium-polymer secondary battery, and converts chemical energy into electrical energy for supply of the same to the portable sound reproducing system. Also, the power supply portion 100 is recharged by electricity received through an adaptor.

The power processor 200 receives power from the power supply portion 100 or directly through the adaptor, rectifies the power to stable voltage current, and supplies the power to the control portion 500 as drive power. When receiving power through the adaptor, the power processor 200 supplies power to the power supply portion 100 for recharging the same.

The information selector 300 is realized through various predetermined keys operated by the user, and outputs electrical signals according to the user selections to control the supply of power, extract data for reproduction, control various functions related to the reproduction of data, and transmit and receive data.

In more detail, the information selector 300 comprises a forward switch for advancing to a subsequent selection when pressed for under a predetermined amount of time of preferably under one second, and which quickly plays data when continually pressed for a predetermined amount of time of preferably over one second; a reverse switch for returning to a beginning of a present selection if the selection is in mid-play or reversing to a previous selection if between selections when pressed for under a predetermined amount of time of preferably under one second, and which quickly plays data in reverse when continually pressed for a predetermined amount of time of preferably over one second; a play/stop switch for reoproducing data when pressed one time, and, in a state of reproducing data, discontinuing the present play mode when pressed again, then cutting off the power; a repeat switch for replaying the present selection when pressed one time, repeating all selections when pressed two times, and cancelling all repeat commands when pressed for a predetermined time of preferably over three seconds; and a random switch for randomly reproducing the selections in a random order when pressed.

The information display portion 400 is realized through an LCD (liquid crystal display) and displays various numbers and letters related to the various modes realized through the above switches.

Figure 2:
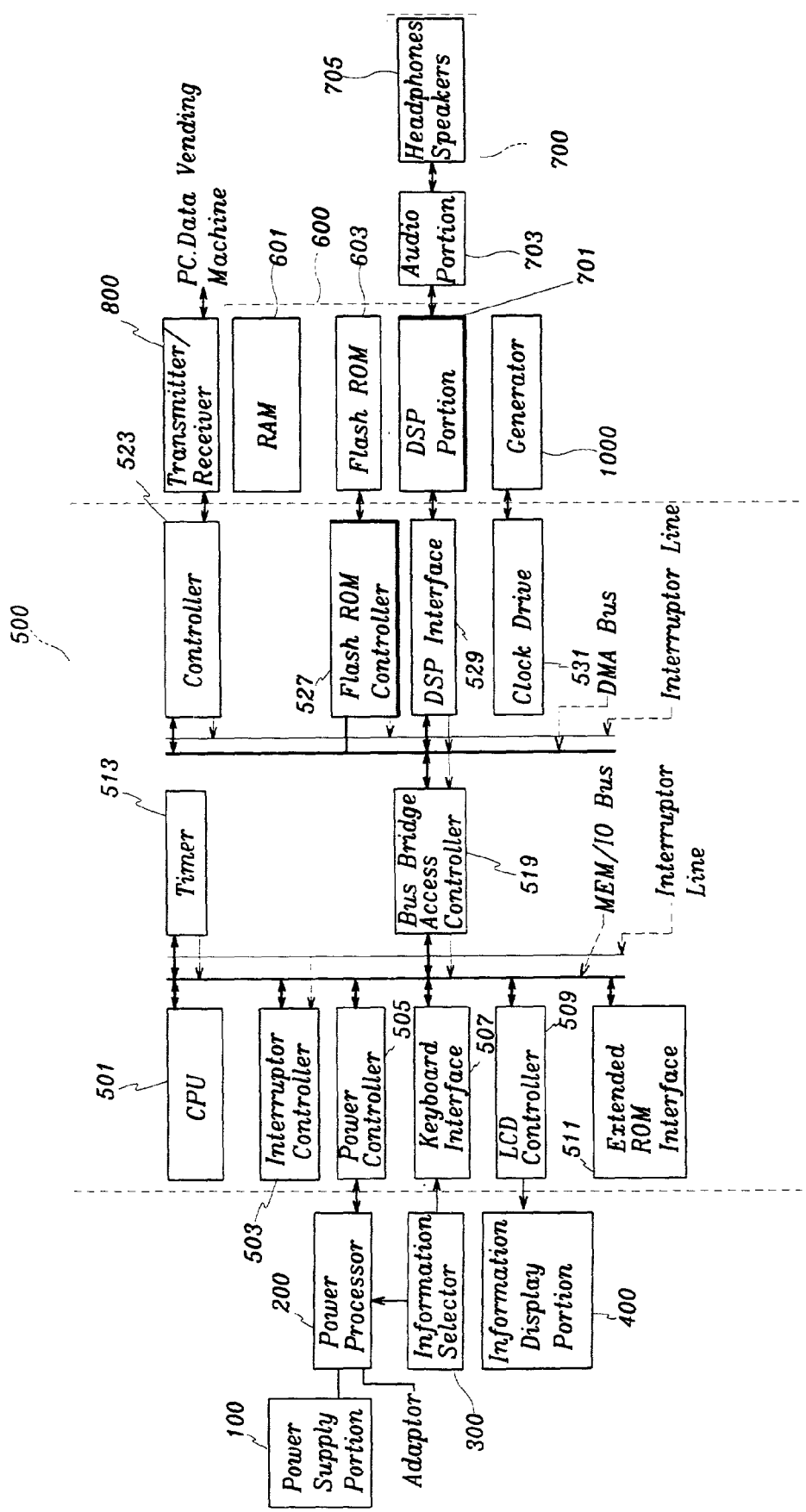
FIG. 2 is a detailed block diagram of the MPEG portable sound reproductin system of FIG. 1.
Figure 3A:
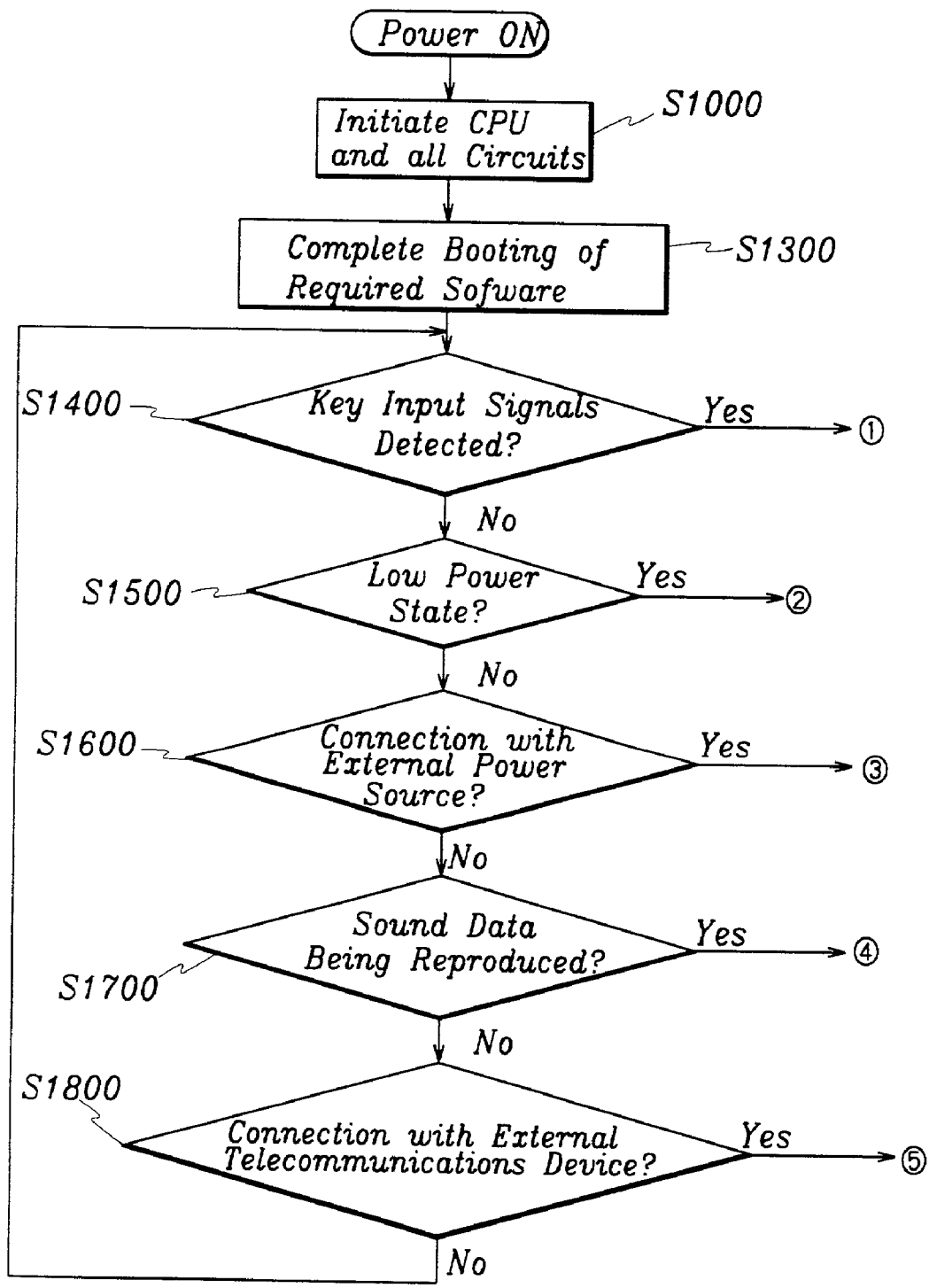
FIGS. 3a–3f are flow charts of a reproducing method for an MPEG portable sound reproducing system according to a preferred embodiment of the present invention.
Figure 3B:
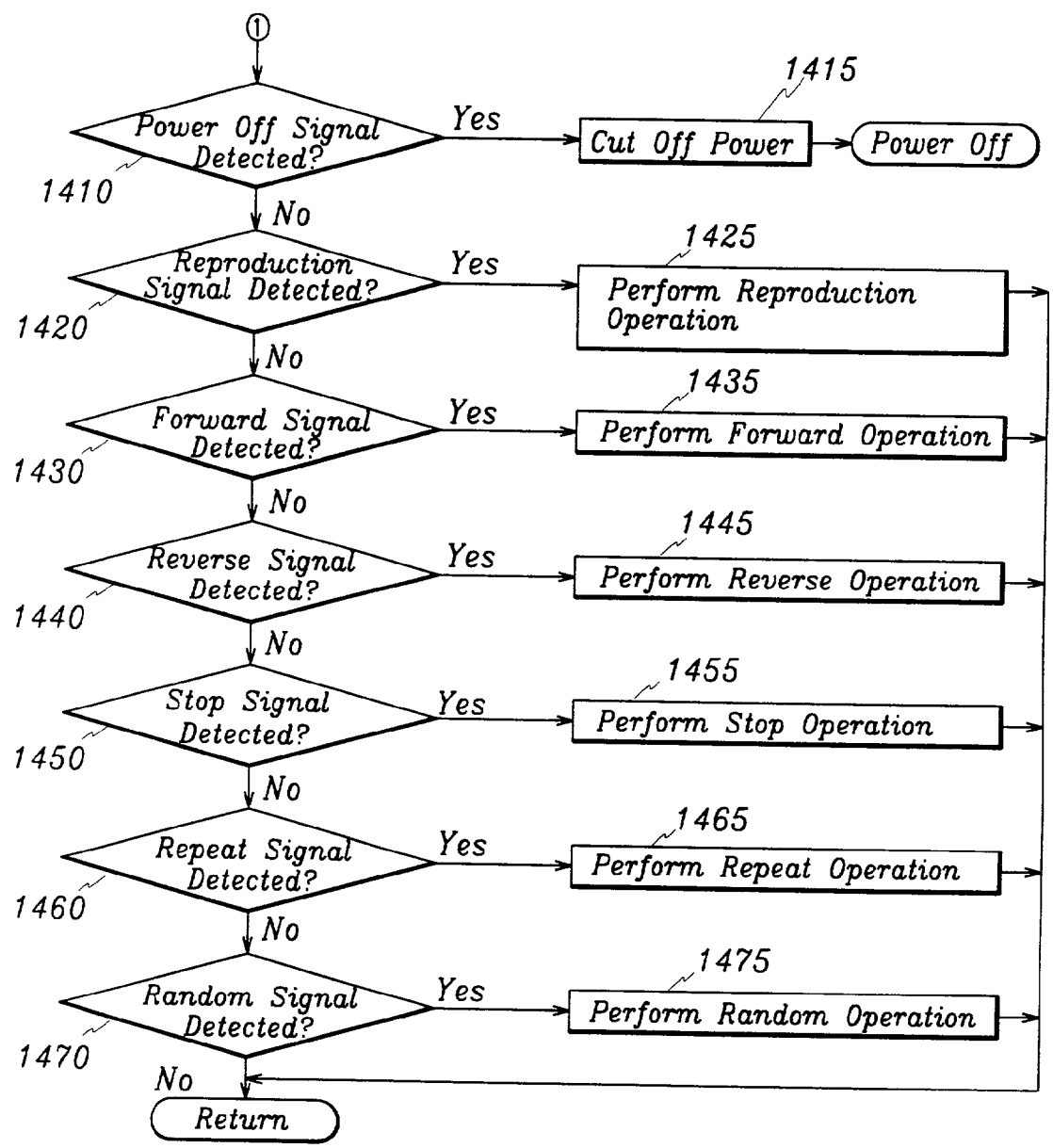
Figure 3C:
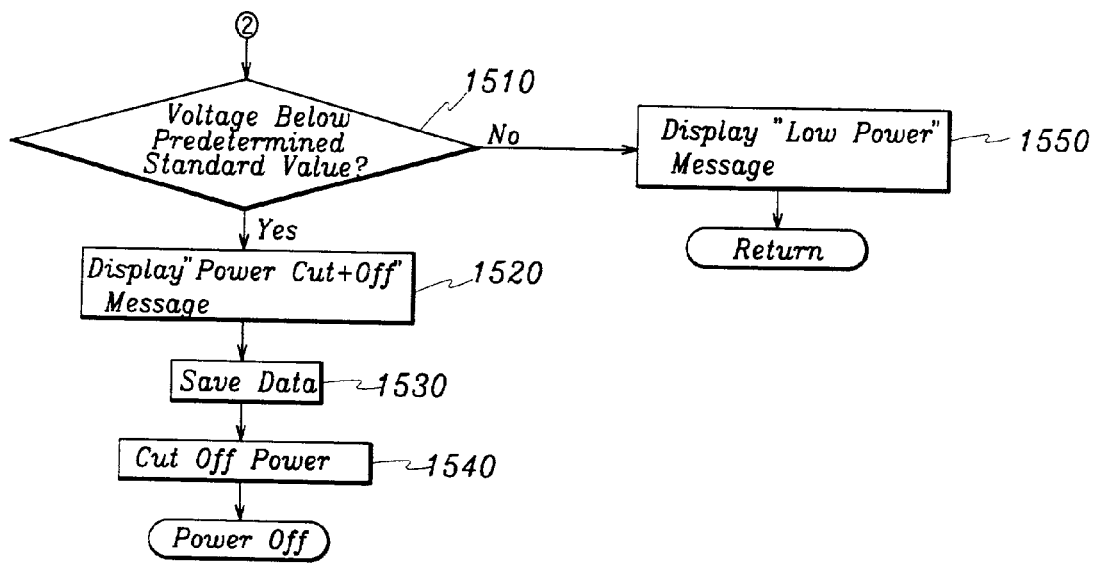
Figure 3D:
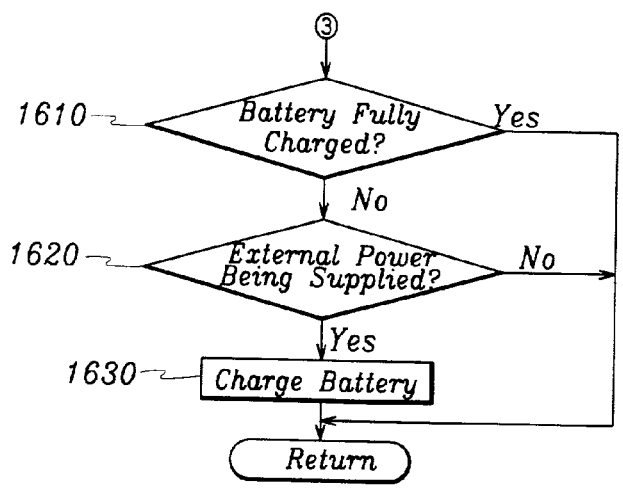
Figure 3E:
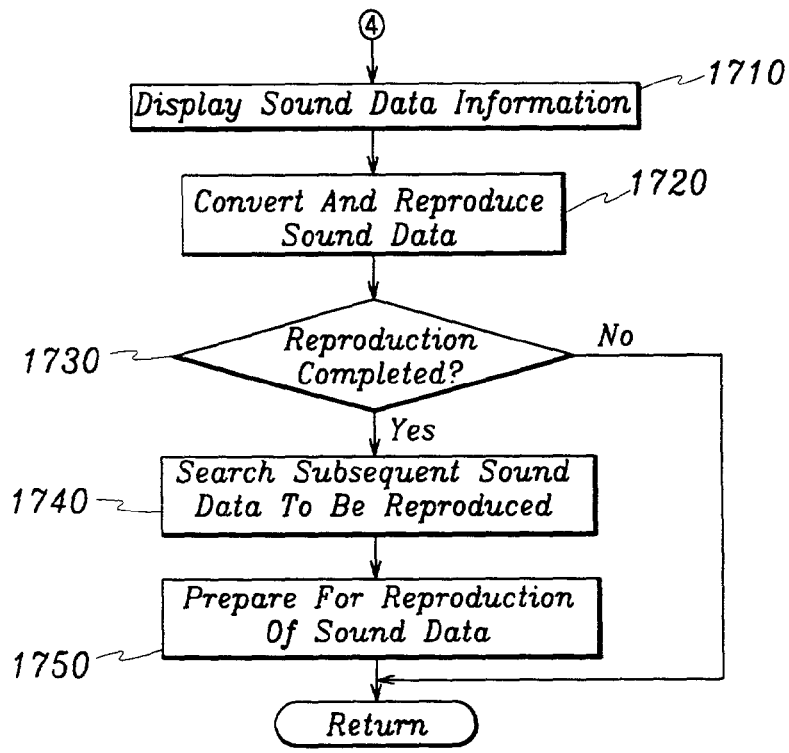
Figure 3F:
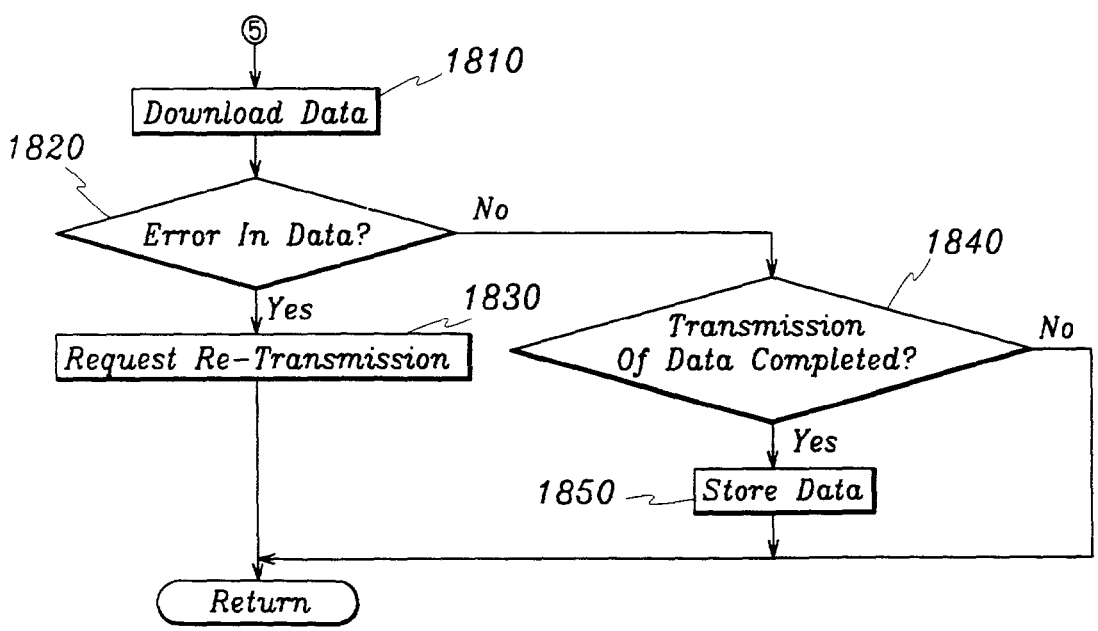

The control portion 500 controls all the various operations for storing and reproducing sound data compressed using the MPEG method. The control portion 500, as shown in FIG. 2, comprises a CPU (central processing unit) 501 for controlling operations related to converting digital data stored using the MPEG method into an audible format; an interrupter controller 503 for outputting a control signal to control the CPU 501 when an input/output operation is ended or an error occurs in the same; a power controller 505 for outputting control signals to stably supply power applied from the power processor 200 as operational power of the CPU 501, and cutting off power when an error occurs; a keyboard interface 507 for interfacing key select signals applied from the information selector 300; an LCD controller 509 for controlling electric current supplied to a matrix of the information display portion 400 to control display during operation of the inventive sound reproducing system; an extended ROM interface 511 for interfacing a with an extended ROM, added to extend a scope of programs or memory, and a flash memory; a timer 513 for counting time information needed for data downloading and reproducing the downloaded data, and data interrupting required to operate the system; a bus bridge access controller 519 outputting control signals for controlling a bus, the bus transmitting data; a controller 523 for controlling input/output of data transmitted and received; a flash ROM controller 527 for activating the flash ROM 603 according to interrupter control signals applied from the CPU 501; a DSP (digital signal processor) interface 529 outputting control signals for controlling an input/output of digital sound data compressed by the MPEG method; and a clock drive 531 which processes a generator clock of a generator 1000 to a predetermined state and drives the same to the CPU 501 as clock signals.

All the above elements of the control, portion 500 are connected through a combination of an interrupt line and an I/O bus.

The data storage portion 600 stores sound data compressed using the MPEG method downloaded through the transmitter/receiver 800 according to signals from the control portion 500. Further, as shown in FIG. 2, the data storage portion 600 is realized through the flash ROM 603, which is a volatile memory element that does not lose data when the power is cut off, for storing and erasing sound data, and data related to application software and other digital data.

The sound reproducing portion 700 converts sound data stored in the data storage portion 600 into an audible format according to signals applied from the control portion 500. The sound reproducing portion 700, as shown in FIG. 2, comprises a DSP portion 701 for returning digital sound data compressed using the MPEG method to its initial state, an audio portion 703 which converts sound signals input from the DSP portion 701 into an audible format, and headphones/speakers 705 for converting electric sound signals input from the audio portion 703 into sound able to be heard by users.

The transmitter/receiver 800 is connected to a PC, data vending machine, or other such external devices and either transmits sound or program data thereto or receives sound or program data therefrom.

A preferred reproducing method of data compressed using the MPEG method for the portable sound reproducing system structured as in the above will be described hereinafter with reference to FIGS. 3*a*–3*f.*

First, if the user presses an ON switch of the information selector 300 to reproduce and listen to particular sound data among all the digital data compressed using the MPEG method and stored in the data storage portion 600, the CPU 501 of the control portion 500 enters an operational mode by receiving power via the power processor 200 from the power supply portion 100 or adaptor (S1000).

Next, the CPU 501 runs the main program and completes booting of required software (S1300), then determines if key signals of the information selector 300, input through the keyboard interface 507 and the MEM/IO bus, are detected (S1400).

If key signals are detected in step S1400, it is determined if there is a power OFF selection signal, selected by the user to cut off power supplied from the power processor 200 (S1410). If the power OFF signal is detected, operational power applied from the power processor 200 is cut off and the system is put in a standby mode (S1415).

If no power OFF signal is detected in step S1400, it is detected if there has been an input of a sound reproduction signal for restoring and reproducing a selection of data compressed using the MPEG method and stored in the flash ROM 603 of the data storage portion 600 (S1420).

If it is determined in step 1420 that the key signal is a reproduction key signal to reproduce sound data stored in the data storage portion 600, the CPU 501 loads the selected sound data to the DSP portion 701 of the sound reproducing portion 700 via the DSP interface 529 of the control portion 500, then returns the digital sound data compressed using the MPEG method to its original state using operating systems software, converts the data into an electric sound signal through the audio portion 703 of the sound reproducing portion 700, and converts the electric signal into a sound signal audible to the user and outputs the same through headphones/speakers 705 (S1425).

In step 1420, if it is detected that the key select signal is not a signal for reproducing sound data or if the system is currently reproducing data, it is then detected if a forward signal has been input (S1430). If a forward key signal is detected in step S1430, the CPU 501 determines if the forward select signal is transmitted for under a predetermined amount of time of less than one second, which if this criterion is met, then advances the selection to the next selection and executes a reproducing operation, and also determines if the forward select signal is transmitted for over a predetermined amount of time of more than one second, and if it is, the present selection is reproduced at a fast speed (S1435).

In step S1430, if a forward key signal is not detected, it is determined if a reverse key signal has been input (S1440). If it has, the current selection being reproduced is either returned to the beginning, or if between selections, a selection is made to the preceding song if the reverse signal is transmitted for under a predetermined time of preferably under one second, or the present playing selection is quickly reversed if the reverse signal is transmitted for over a predetermined amount of time of preferably over one second (S1445).

If a reverse signal is not detected in step 1440, it is then detected if a stop signal has been input (S1450). Here, if a stop signal is detected, it is further determined, using an installed program, if a signal of a predetermined number of times of preferably one time has been input and the present mode is the play mode, in which case the present reproduction operation is discontinued, an if in a stopped mode reproduction is started. Further, in a state where the play mode has been disontinued, if it is detected that the stop signal is transmitted for a predetermined amount of time of preferably more than three seconds, standby power is controlled to OFF (S1455).

In step S1450, if a stop signal is not detected or if it is determined that the system is in a play mode, it is then determined if a repeat signal has been input (S1460). If a repeat signal is detected, the number of input times is determined using an installed program such that the present selection is repeated when it is detected that the signal has been input a predetermined number of times of preferably one time, all sound data stored in the memory of the flash ROM 603 is repeated when the input of two signals is detected, and any repeat command is cancelled when it is detected that the signal is input during a repeat operation (S1465).

Further, if no repeat signal is detected in step 1460, it is then determined if a random signal has been input (S1470). If a random signal is detected in this step, selections are reproduced in random order (S1475), and if a random signal is not detected, the operation to reproduce the sound data compressed using the MPEG method is repeated.

In the above state where sound data selected by the user is being reproduced according to key signals input from the information selector 300, operational power is analyzed in the power processor 200 to determine if a Low Power state exists, disenabling a reproduction operation to be performed, in the power supply portion 100 (S1500). If it is determined that the power supply portion 100 is in a Low Power state in step 1500, it is then determined if the detected present voltage is below a predetermined standard value that would impede the normal reproducing of sound data (S1510).

In the above, if it is determined that the voltage of the power supply portion 100 is less than the predetermined standard value, the control portion 500 outputs a predetermined control signal for display of a warning to the LCD controller 509 via the MEM/IO bus. Here, the LCD controller 509 adjusts power supplied to the matrix of the information display portion 400 such that a "power cut off" message is displayed thereon (S1520).

Simultaneously with the displaying of the "power cut off" message, the CPU 501 of the control portion 500 inputs a data storage signal to the flash ROM 603 of the data storage portion 600 such that the present state is saved (S1530), and controls the power controller 505 via the MEM/IO bus to cut off the supply of power to the power processor (S1540).

In step 1510, if it is determined that the voltage of the power supply portion 100 is above the predetermined standard value, enabling the normal operation of the system, the control portion 500 controls the information display portion 400 via the LCD controller 509 such that a "Low Power" message is displayed (S1550).

After the checking of the power state in step S1500, the CPU 501 of the control portion 500 determines if the power processor 200 is connected to an external power source through the adaptor (S1600). If it is detected that there is a connection with an external power source in step S1600, it is then determined if the power supply portion 100 is fully charged (S1610).

In the above, if it is determined that the power supply portion 100 is fully charged, the charging operation is discontinued, to prevent damage to the power supply portion 100 caused by overcharging, and if it is determined that the power supply portion 100 is not fully charged, it is then determined if power from an external power source is being supplied through the adaptor (S1620). Here, if external power is being supplied in a state where the power supply portion 100 is not fully charged, the power is then supplied to the power supply portion 100 to charge the same (S1630).

After step 1600, where it is determined if there is a connection with an external power source, it is then determined if sound data is being reproduced according to selections made by the user at the information selector 300 (S1700). If sound data is being reproduced in this step, the CPU 501 of the control portion 500 analyzes the sound data checking, for example, data reproduction time, title of selection, type of music, remaining play time for the selection, etc.—and displays the information through the information display portion 400 by controlling the LCD controller 509 (S1710).

Further, the CPU 501 of the control portion 500 accesses the sound data compressed using the MPEG method in the flash ROM 603 of the data storage portion 600, and transmits this sound data to the DSP portion 701 of the sound reproducing portion 700 through the DSP interface 529. Accordingly, the DSP portion 701 processes the MPEG-compressed digital sound data to a predetermined state and converts it to sound signals via the audio portion 703, then reproduces the sound data through headphones/speakers 705 such that the user can listen to the sound (S1720).

Next, it is determined if the selected sound data has been completely reproduced (S1730). If it has, a subsequent sound data selection is searched from the flash ROM 603 (S1740), then sound data to be reproduced is loaded from the flash ROM 603 and preparations are made to reproduce sound data (S1750).

After step S1700, where it is determined if sound data is being reproduced, the CPU 501 of the control portion 500 analyzes signals from the controller 523 to determine if the transmitter/receiver 800 is connected to an external telecommunications system of, for example, a computer having a modem or other telecommunications device installed therein, or a data vending machine selling a variety of data and programs of music, video games, etc. (S1800).

If it is determined in step 1800 that the transmitter/receiver 800 is connected to an external telecommunications system, the inventive system is changed to a downloading load, the data is downloaded (S1810), and it is determined if an error exists in the downloaded data (S1820).

In the above, if it is determined that an error exists in the downloaded data, the CPU 501 of the control portion 500 performs control so that the data is re-transmitted, and if no error exists in the data, the data is stored (S1830). Further, if it is determined that no error exists in the transmitted data in step 1820, the CPU 501 determines if transmission of the data is completed (S1840), designates an address sphere in the data storage portion 600, then downloads and stores the data (S1850).

In the MPEG portable sound reproducing system structured and reproducing MPEG-compressed data as in the above, as sound data is compressed using the MPEG method and stored in a semiconductor chip or other memory element, then reproduced in a format audible to the user, convenience is provided by eliminating the need for records, tapes, CDs, and other such memory media, and many of the drawbacks of using memory media in prior art reproduction devices—reduction in sound quality after recording or repeated playing, fragility of memory media necessitating the need to take great care in storing the same, etc.—are overcome.

Further, because it is possible to connect the inventive system to telecommunications networks and data vending machines to download various data, benefits of speed, convenience, and low cost are provided to the user.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A portable audio device suitable for reproducing MPEG encoded data, the portable audio device comprising:
    a plurality of inputs, including a forward input, a reverse input, a play control input, and a random input;
    a non-removable data storage to store compressed digitized audio data;
    a display;
    an audio output;
    at least one processor, responsive to selection of at least one of the plurality of inputs, to convert selected compressed digitized audio data stored in the non-removable data storage for reproduction by the audio output and to provide information to the display;
    a battery; and
    wherein, when a first selection of compressed digitized audio data is being reproduced, the display provides at least one of the first selection's title, type, remaining playtime, and reproduction time;
    wherein, when a second selection of compressed digitized audio data is being reproduced and in response to selection of the forward input for a first amount of time, the portable audio device advances to another selection of compressed digitized audio data;
    wherein, when a third selection of compressed digitized audio data is being reproduced, in response to selection of the reverse input for a second amount of time, the portable audio device begins playing the third selection from a beginning of the third selection of compressed digitized audio data;
    wherein, when a fourth selection of compressed digitized audio data is being reproduced, in response to selection of the play control input, the portable audio device stops playing the fourth selection of compressed digitized audio data;

wherein, in response to selection of the random input, the portable audio device reproduces selections of the compressed digitized audio data stored in the non-removable data storage in a random order; and wherein, when the portable audio device is in a selected mode of operation and a voltage of the battery falls below a selected level, the display provides an indication relating to a power level of the battery.

2. The portable audio device of claim 1, wherein the compressed digitized audio data is compressed according to a Moving Pictures Expert Group (MPEG) compression standard.

3. The portable audio device of claim 1, wherein:

when the second selection of compressed digitized audio data is being reproduced and in response to selection of the forward input for a third amount of time, the portable audio device reproduces the second selection of compressed digitized audio data at a rapid speed;

when the third selection of compressed digitized audio data is being reproduced, in response to selection of the reverse input for a fourth amount of time, the portable audio device begins advancing toward the beginning of the third selection.

4. The portable audio device of claim 3, wherein:

when the portable audio device stops playing the fourth selection of compressed digitized audio data in response to selection of the play control input, a subsequent selection of the play control input causes the portable audio device to begin reproducing the fourth selection of compressed digitized audio data.

5. The portable audio device of claim 4, further comprising a plurality of buttons, including:

a reverse button, wherein the reverse input is selected when the reverse button is depressed;

a forward button, wherein the forward input is selected when the forward button is depressed; and a play/stop button, wherein the play control input is selected when the play/stop button is depressed.

6. The portable audio device of claim 4, wherein the first time is less than the third time, and the second time is less than the fourth time.

7. The portable audio device of claim 4, wherein the first and second times are less than approximately 1 second and the second and fourth times are greater than approximately 1 second.

8. The portable audio device of claim 1, wherein selecting the play control input for an extended period turns the portable audio device off.

9. The portable audio device of claim 1, wherein the plurality of inputs includes a repeat input and wherein, in response to selection of the repeat input, the portable audio device reproduces at least one selection of the compressed digitized audio data stored in the non-removable data storage in a repetitive manner.

10. The portable audio device of claim 5, wherein the at least one processor includes first and second processors.

11. The portable audio device of claim 10, wherein the first processor determines which input signals are being selected, while the second processor decompresses the compressed digital audio data.

12. The portable audio device of claim 11, wherein the first processor functions as a CPU and the second processor functions as a DSP.

13. The portable audio device of claim 11, further comprising a transmitter/receiver for receiving compressed digital sound data from a personal computer.

14. The portable audio device of claim 1, further comprising a transmitter/receiver for receiving compressed digital sound data from a data vending machine attached to a telecommunications network.

15. A portable audio device suitable for reproducing MPEG encoded data, the portable audio device comprising:

a plurality of inputs, including a forward input, a reverse input, a play control input, and a repeat input;

a non-removable data storage to store compressed digitized audio data;

a display;

an audio output;

at least one processor, responsive to selection of at least one of the plurality of inputs, to convert selected compressed digitized audio data stored in the non-removable data storage for reproduction by the audio output and to provide information to the display;

a battery; and wherein, when a first selection of compressed digitized audio data is being reproduced, the display provides at least one of the first selection's title, type, remaining playtime, and reproduction time;

wherein, when a second selection of compressed digitized audio data is being reproduced and in response to selection of the forward input for a first amount of time, the portable audio device advances forward to another selection of compressed digitized audio data;

wherein, when a third selection of compressed digitized audio data is being reproduced, in response to selection of the reverse input for a second amount of time, the portable audio device begins playing the third selection from a beginning of the third selection of compressed digitized audio data;

wherein, when a fourth selection of compressed digitized audio data is being reproduced, in response to selection of the play control input, the portable audio device stops playing the fourth selection of compressed digitized audio data;

wherein, in response to selection of the repeat input, the portable audio device reproduces at least one selection of the compressed digitized audio data stored in the non-removable data storage in a repetitive manner; and wherein, when the portable audio device is in a selected mode of operation and a voltage of the battery falls below a selected level, the display provides an indication relating to a power level of the battery.

16. The portable audio device of claim 15, wherein the compressed digitized audio data is compressed according to a Moving Pictures Expert Group (MPEG) compression standard.

17. The portable audio device of claim 15, wherein:

when the second selection of compressed digitized audio data is being reproduced and in response to selection of the forward input for a third amount of time, the portable audio device reproduces the second selection of compressed digitized audio data at a rapid speed;

when the third selection of compressed digitized audio data is being reproduced, in response to selection of the reverse input for a fourth amount of time, the portable audio device begins advancing toward the beginning of the third selection.

18. The portable audio device of claim 17, wherein:

when the portable audio device stops playing the fourth selection of compressed digitized audio data in response to selection of the play control input, a subsequent selection of the play control input causes the portable audio device to begin reproducing the fourth selection of compressed digitized audio data.

19. The portable audio device of claim 18, further comprising a plurality of buttons, including:
   a reverse button, wherein the reverse input is selected when the reverse button is depressed;
   a forward button, wherein the forward input is selected when the forward button is depressed; and
   a play/stop button, wherein the play control input is selected when the play/stop button is depressed.

20. The portable audio device of claim 17, wherein the first time is less than the third time, and the second time is less than the fourth time.

21. The portable audio device of claim 17, wherein the first and second times are less than approximately 1 second and the second and fourth times are greater than approximately 1 second.

22. The portable audio device of claim 15, wherein selecting the play control input for an extended period turns the portable audio device off.

23. The portable audio device of claim 15, wherein the plurality of inputs includes a random input and wherein, in response to selection of the random input, the portable audio device reproduces selections of the compressed digitized audio data stored in the non-removable data storage in a random order.

24. The portable audio device of claim 19, wherein the at least one processor includes first and second processors.

25. The portable audio device of claim 24, wherein the first processor determines which input signals are being selected and the second processor decompresses the compressed digital sound data.

26. The portable audio device of claim 25, wherein the first processor functions as a CPU and the second processor functions as a DSP.

27. The portable audio device of claim 25, further comprising a transmitter/receiver for receiving compressed digital sound data from a personal computer.

28. The portable audio device of claim 15, further comprising a transmitter/receiver for receiving compressed digital sound data from a data vending machine attached to a telecommunications network.

29. The portable audio device of claim 15, wherein the type provided by the display comprises a type of music.

30. The portable audio device of claim 15, wherein the first selection, the second selection, the third selection, and the fourth selection of compressed digitized audio data include different selections of music.

* * * * *

US007065417C1

(12) INTER PARTES REEXAMINATION CERTIFICATE (865th)
United States Patent
Moon et al.

(10) Number: US 7,065,417 C1
(45) Certificate Issued: Apr. 25, 2014

(54) MPEG PORTABLE SOUND REPRODUCING SYSTEM AND A REPRODUCING METHOD THEREOF

(75) Inventors: Kwang-su Moon, Seoul (KR); Jung-ha Hwang, Seoul (KR)

(73) Assignee: Texas MP3 Technologies, Ltd., Marshall, TX (US)

Reexamination Request:
No. 95/000,278, Jul. 12, 2007

Reexamination Certificate for:
Patent No.: 7,065,417
Issued: Jun. 20, 2006
Appl. No.: 10/059,777
Filed: Jan. 29, 2002

Related U.S. Application Data

(62) Division of application No. 09/061,647, filed on Apr. 17, 1998, now Pat. No. 6,629,000.

(30) Foreign Application Priority Data

Nov. 24, 1997 (KR) ...................................... 97-62315

(51) Int. Cl.
 *G06F 17/00* (2006.01)
(52) U.S. Cl.
 USPC .................. 700/94; 369/63; 381/61; 704/272
(58) Field of Classification Search
 None
 See application file for complete search history.

(56) References Cited

To view the complete listing of prior art documents cited during the proceeding for Reexamination Control Number 95/000,278, please refer to the USPTO's public Patent Application Information Retrieval (PAIR) system under the Display References tab.

*Primary Examiner* — Joseph R. Pokrzywa

(57) ABSTRACT

Disclosed is an MPEG portable sound reproducing system and a method for reproducing sound data compressed using the MPEG method. The inventive system includes power supply means for supplying operational power to the system, the power supply means being realized through a secondary battery; power processing means for rectifying power supplied from the power supply means to stable voltage and current; information display means for displaying numbers and combinations of letters related to operational states of the system; control means for controlling all operations of converting and reproducing sound data compressed using the MPEG method; data storage means for storing MPEG-compressed sound data in a designated address according to signals output from the control means; information selecting means for selecting general operations to reproduce, download, and apply selected sound data stored in the data storage means; sound reproducing means for converting sound data stored in the data storage means into a format audible to users according to signals output from the control means; and transmitting/receiving means for transmitting and receiving sound data and program data from external devices.

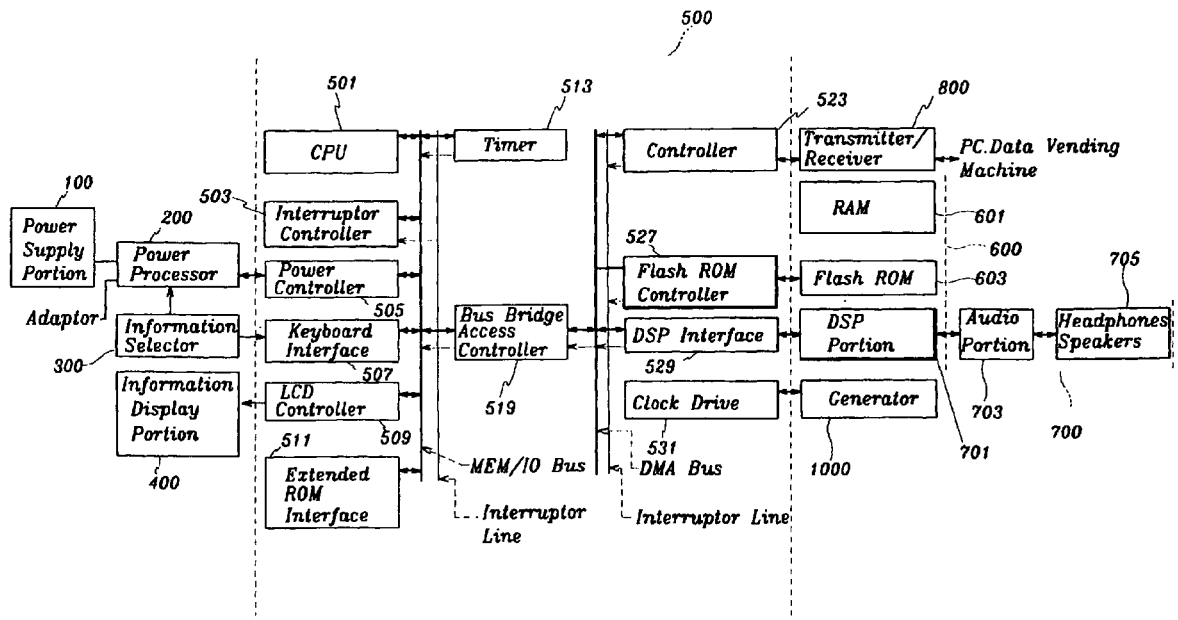

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-30 are cancelled.

New claim 31 is added and determined to be patentable.

31. *A portable audio device suitable for reproducing MPEG encoded data, the portable audio device comprising:*
   *a plurality of inputs, including a forward input, a reverse input, a play control input, and a random input;*
   *a non-removable semiconductor storage medium to store compressed digitized audio data;*
   *a display;*
   *an audio output;*
   *at least one processor, responsive to selection of at least one of the plurality of inputs, to convert selected compressed digitized audio data stored in the non-removable data storage for reproduction by the audio output and to provide information to the display, the at least one processor including a CPU;*
   *a battery;*
   *a power processor that controls operational power within the portable audio device that is operable to analyze operational power and determine if operational power is below a predetermined value and if operational power is below the predetermined value, reproduction of selections of the compressed digitized audio data is disabled and a present state of the portable audio device is stored;*
   *an interrupter controller that outputs control signals to control the CPU in association with input/output operations;*
   *a RAM;*
   *a flash ROM;*
   *a flash ROM controller that activates the flash ROM according to interrupter control signals applied from the CPU; and*
   *a timer operable to count time information for reproduction of selections of the compressed digitized audio data;*
   *wherein, when a first selection of compressed digitized audio data is being reproduced, the display provides the first selection's title and reproduction time;*
   *wherein, when a second selection of compressed digitized audio data is being reproduced and in response to selection of the forward input for a first amount of time, the portable audio device advances to another selection of compressed digitized audio data;*
   *wherein, when a third selection of compressed digitized audio data is being reproduced, in response to selection of the reverse input for a second amount of time, the portable audio device begins playing the third selection from a beginning of the third selection of compressed digitized audio data;*
   *wherein, when a fourth selection of compressed digitized audio data is being reproduced, in response to selection of the play control input, the portable audio device stops playing the fourth selection of compressed digitized audio data and wherein after the play control input has been selected to stop playing the fourth selection of compressed digitized audio data, a subsequent selection of the play control input for a third amount of time causes the portable audio device to continue reproducing the fourth selection of compressed digitized audio data and selection of the play control input for a fourth amount of time that is greater than the third amount of time turns the portable audio device off;*
   *wherein, in response to selection of the random input, the portable audio device reproduces selections of the compressed digitized audio data stored in the non-removable data storage in a random order; and*
   *wherein, when the portable audio device is in a selected mode of operation and a voltage of the battery falls below a selected level, the display provides an indication relating to a power level of the battery.*

* * * * *